(12) United States Patent
Kimura

(10) Patent No.: US 8,044,722 B2
(45) Date of Patent: Oct. 25, 2011

(54) OSCILLATION FREQUENCY CONTROL CIRCUIT

(75) Inventor: Hiroki Kimura, Chitose (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 87 days.

(21) Appl. No.: 12/591,189

(22) Filed: Nov. 12, 2009

(65) Prior Publication Data

US 2010/0060365 A1   Mar. 11, 2010

Related U.S. Application Data

(63) Continuation of application No. PCT/JP2008/002874, filed on Oct. 10, 2008.

(30) Foreign Application Priority Data

Nov. 16, 2007   (JP) .............................. P.2007-298548

(51) Int. Cl.
*H03L 7/085* (2006.01)

(52) U.S. Cl. ............. 331/14; 331/18; 331/1 A; 331/176; 327/156

(58) Field of Classification Search ............ 331/14, 331/15, 17, 18, 1 A, 66, 176; 327/156; 375/376
See application file for complete search history.

(56) References Cited

U.S. PATENT DOCUMENTS

| | | | | |
|---|---|---|---|---|
| 3,882,412 A | * | 5/1975 | Apple, Jr. | 331/1 A |
| 5,410,572 A | * | 4/1995 | Yoshida | 375/376 |
| 2003/0076184 A1 | * | 4/2003 | Oita | 331/176 |

FOREIGN PATENT DOCUMENTS

| | | |
|---|---|---|
| GB | 2 253 750 | 9/1992 |
| GB | 2 319 410 | 5/1998 |
| JP | 1-222519 | 9/1989 |
| JP | 2000-083003 | 3/2000 |
| JP | 2003-179489 | 6/2003 |
| JP | 6-197014 | 7/2004 |
| JP | 2005-101956 | 4/2005 |
| WO | 00/38324 | 6/2000 |

OTHER PUBLICATIONS

International Search Report dated Jan. 13, 2009.

\* cited by examiner

*Primary Examiner* — Ryan Johnson
(74) *Attorney, Agent, or Firm* — Jacobson Holman PLLC

(57) ABSTRACT

To provide a highly stable oscillation frequency control circuit wherein the frequency thereof is corrected, an adequate range of the input levels of external reference signals is determined in accordance with temperature characteristics in detecting the external reference signal, and the control voltage to a VCO is controlled within and outside the adequate range. An oscillation frequency control circuit includes a selection switch that connects the phase comparator to the loop filter in an external reference synchronization mode and that connects the fixed voltage supplying circuit to the loop filter in a fixed voltage mode, and a CPU that switches the selection switch to the external reference synchronization mode or to the fixed voltage mode based on whether the detected voltage of an external reference signal level is within or outside of the adequate range.

8 Claims, 6 Drawing Sheets

OSCILLATION FREQUENCY CONTROL CIRCUIT

This is a Continuation of PCT/JP2008/002874 filed Oct. 10, 2008 and published in Japanese, which has a priority of Japanese no. 2007-298548 filed Nov. 16, 2007, hereby incorporated by reference.

BACKGROUND OF THE INVENTION

1. Field of the Invention

The present invention relates to an oscillation frequency control circuit of an oscillator, and especially relates to an oscillation frequency control circuit that synchronizes with an external reference signal, corrects frequency thereof, and is highly stable in accordance with temperature characteristics of detection of the external reference signal.

2. Description of the Related Art

Required precision for a frequency reference signal becomes increasingly higher in a base station of next-generation mobile communication, terrestrial digital broadcasting and the like.

As the frequency reference signal, a cesium frequency reference oscillator, a rubidium frequency reference oscillator, a frequency synchronization type reference oscillator by a GPS signal and the like are used in a system of a broadcasting and communication field.

However, the oscillators are generally expensive, so that the reference signal from the oscillators is divided to be used as a reference signal source of a device.

The divided reference signal is used as a reference clock of a communication system.

Specifically, this is used as a reference signal of phase comparison of a phase locked loop (PLL) circuit, the reference clock signal of a digital signal processor (DSP) and a field programmable gate array (FPGA) and a sampling clock of a digital/analog (DA) converter and an analog/digital (AD) converter.

[Conventional PLL Circuit: FIG. 6]

Next, a conventional PLL circuit is described with reference to FIG. 6. FIG. 6 is a configuration block diagram of a general PLL circuit.

The PLL circuit is provided with a phase comparator 32 that compares an external reference signal (Fref) and a signal divided into 1/N to output a phase difference signal, a charge pump 33 that outputs phase difference with voltage of pulse width, a loop filter 34 that smoothes output voltage from the charge pump 33, a voltage controlled crystal oscillator (VCXO) 35 that changes the frequency by control voltage from the loop filter 34 to oscillation-output desired frequency (internal reference signal: output frequency), and a divider 36 that divides an output (internal reference signal) of the VCXO 35 into 1/N as shown in FIG. 6.

Meanwhile, the internal reference signal is a signal of N×Fref.

The PLL circuit is for obtaining an oscillation output synchronized with the reference signal by performing feed-back control to the VCXO 35 inside thereof such that the phase difference between the externally input reference signal and the VCXO 35 inside thereof is constant.

Specifically, the phase comparator 32 is for performing high-precision signal generation by performing PLL control in which the phases of the highly stable external reference signal and of the output signal from the VCXO 35, which is frequency-controlled by input voltage, are compared and direct-current voltage obtained by smoothing a phase comparison result is fed back to the VCXO 35. The PLL circuit is widely used in communication and broadcasting devices.

Meanwhile, as the conventional art relating to the oscillation frequency control circuit in the conventional oscillator, there are Japanese Patent Application Laid-Open No. 2000-083003 (Patent Document 1) and Japanese Patent Application Laid-Open No. 2003-179489 (Patent Document 2).

The Patent Document 1 discloses a free-running frequency adjusting method in which count operation in synchronization with an output signal of a voltage-controlled oscillator (VCO) in which a frequency counter is input in a time period corresponding to the pulse width is performed, a counted value corresponding to oscillation frequency of the VCO is held in a latch circuit, and, when a counted value deviates from a predetermined range, the CPU changes applied voltage of the VCO to adjust such that the free-running frequency is within the predetermined range.

Also, the Patent Document 2 discloses a phase lock loop circuit having an automatic adjusting function of the free-running frequency of the voltage-controlled oscillator in which a microcomputer counts a pulse of an output pulse signal of the VCO in a period in which the output of the phase comparator is in a predetermined level, updates data for control in accordance with the counted value, and couples the data with a signal from a low pas filter (LPF) as an analog signal in a digital analog converter (DAC) to obtain a frequency control signal of the VCO.

SUMMARY OF THE INVENTION

However, in the above-described conventional PLL circuit, although there has not been a problem when an input level of the external reference signal is within an adequate range, there has been a problem that stable external reference synchronization operation may not be performed when this is outside the adequate range.

Further, there has been a problem that, when there are temperature characteristics in the filter, the amplifier, the detector circuit and the like for detecting the external reference signal, it is difficult to determine whether the input level of the external reference signal is within the adequate range or outside the adequate range due to variation in the detected voltage by the temperature characteristics even when this is a constant input level.

Also, although the free-running frequency is adjusted by counting the output of the VCO or by counting the output of the phase comparator in the Patent Documents 1 and 2, the frequency adjustment is not appropriately performed by directly detecting abnormality in the external reference signal.

The present invention has been achieved in view of the above-described circumstances, and an object thereof is to provide the highly stable oscillation frequency control circuit in which the frequency thereof is corrected, the adequate range of the input level of the external reference signal is determined in accordance with the temperature characteristics in detecting the external reference signal, and the control voltage to the voltage-controlled oscillator is controlled within and outside the adequate range.

In order to solve the problem in the above-described conventional example, the present invention is an oscillation frequency control circuit, having: a voltage-controlled oscillator; a divider that divides an output from the voltage-controlled oscillator; a phase comparator that compares phases of an external reference signal and of the output from the divider to output a phase difference signal; a loop filter that smoothes the output from the phase comparator to output; a detector circuit that detects an input level of the external reference signal; a temperature sensor that detects temperature in the vicinity of the detector circuit; a memory that stores a voltage value for determining an adequate range and outside of the adequate range in accordance with temperature characteristic for detected voltage of the external reference signal; a fixed voltage supplying circuit that supplies fixed voltage; a selection switch that connects the phase comparator to the loop filter in an external reference synchronization mode or connects the fixed voltage supplying circuit to the loop filter in a fixed voltage mode; and a controlling unit that outputs a control signal to switch the selection switch to the external reference synchronization mode when the detected voltage of an external reference signal level detected by the detector circuit is within the adequate range in accordance with the temperature characteristics of the temperature detected by the temperature sensor, and outputs the control signal to switch the selection switch to the fixed voltage mode when the detected voltage is outside the adequate range in accordance with the temperature characteristics of the temperature detected by the temperature sensor.

The present invention is the above-described oscillation frequency control circuit, wherein the controlling unit outputs the control signal to switch the selection switch to the fixed voltage mode at the time of start-up, and outputs the control signal to switch the selection switch to the external reference synchronization mode when the detected voltage of the external reference signal level detected by the detector circuit is within the adequate range.

The present invention is the above-described oscillation frequency control circuit, wherein the voltage value for determining the adequate range and the outside of the adequate range in accordance with the temperature characteristics for the detected voltage of the external reference signal level is stored in the memory for each of the temperature characteristics based on a detection threshold in accordance with the temperature characteristics.

The present invention is the above-described oscillation frequency control circuit, wherein the voltage value for determining the adequate range and the outside of the adequate range in accordance with the temperature characteristics for the detected voltage of the external reference signal level stores an upper limit value HL of the adequate range, a lower limit value LH of the adequate range, an upper limit acceptable value HH acceptable on a boundary with the outside of the adequate range, and a lower limit acceptable value LL acceptable on the boundary with the outside of the adequate range in the memory for each of the temperature characteristics.

The present invention is the above-described oscillation frequency control circuit, wherein the controlling unit outputs the control signal to switch the selection switch to the fixed voltage mode in a case in which the value of the detected voltage of the external reference signal level is within the adequate range and when the value of the detected voltage increases to be not lower than the upper limit value HL to be higher than the upper limit acceptable value HH, or when the value of the detected voltage decreases to be not higher than the lower limit value LH to be lower than the lower limit acceptable value LL, and outputs the control signal to switch the selection switch to the external reference synchronization mode in a case in which the value of the detected voltage of the external reference signal level is outside the adequate range and when the value of the detected voltage increases to be higher than the lower limit acceptable value LL to be not lower than the lower limit value LH of the adequate range, or when the value of the detected voltage decreases to be lower than the upper limit acceptable value HH to be not higher than the upper limit value HL of the adequate range.

According to the present invention, there is an oscillation frequency control circuit, having: a voltage-controlled oscillator; a divider that divides an output from the voltage-controlled oscillator; a phase comparator that compares phases of an external reference signal and of the output from the divider to output a phase difference signal; a loop filter that smoothes the output from the phase comparator to output; a detector circuit that detects an input level of the external reference signal; a temperature sensor that detects temperature in the vicinity of the detector circuit; a memory that stores a voltage value for determining an adequate range and outside of the adequate range in accordance with temperature characteristic for detected voltage of the external reference signal; a fixed voltage supplying circuit that supplies fixed voltage; a selection switch that connects the phase comparator to the loop filter in an external reference synchronization mode or connects the fixed voltage supplying circuit to the loop filter in a fixed voltage mode; and a controlling unit that outputs a control signal to switch the selection switch to the external reference synchronization mode when the detected voltage of an external reference signal level detected by the detector circuit is within the adequate range in accordance with the temperature characteristics of the temperature detected by the temperature sensor, and outputs the control signal to switch the selection switch to the fixed voltage mode when the detected voltage is outside the adequate range in accordance with the temperature characteristics of the temperature detected by the temperature sensor, so that there is an effect of correcting the frequency thereof, determining the adequate range of the input level of the external reference signal in accordance with the temperature characteristics in detecting the external reference signal, and controlling the control voltage to the voltage-controlled oscillator within and outside the adequate range, thereby performing the highly stable oscillation operation.

According to the present invention, there is the above-described oscillation frequency control circuit, wherein the controlling unit outputs the control signal to switch the selection switch to the fixed voltage mode at the time of start-up, and outputs the control signal to switch the selection switch to the external reference synchronization mode when the detected voltage of the external reference signal level detected by the detector circuit is within the adequate range, so that there is an effect of performing the stable external reference synchronization operation even at the time of start-up.

According to the present invention, there is the above-described oscillation frequency control circuit, wherein the controlling unit outputs the control signal to switch the selection switch to the fixed voltage mode in a case in which the value of the detected voltage of the external reference signal level is within the adequate range and when the value of the detected voltage increases to be not lower than the upper limit value HL to be higher than the upper limit acceptable value HH, or when the value of the detected voltage decreases to be not higher than the lower limit value LH to be lower than the lower limit acceptable value LL, and outputs the control signal to switch the selection switch to the external reference synchronization mode in a case in which the value of the detected voltage of the external reference signal level is outside the adequate range and when the value of the detected voltage increases to be higher than the lower limit acceptable value LL to be not lower than the lower limit value LH of the adequate range, or when the value of the detected voltage decreases to be lower than the upper limit acceptable value HH to be not higher than the upper limit value HL of the adequate range, so that the selection switch is not switched frequently on the boundary between the adequate range and the outside of the adequate range, and there is an effect of stabilizing the switching operation.

<Description of Reference Numerals>

| | |
|---|---|
| 11 | filter |
| 12 | phase comparator |
| 13 | selection switch |
| 14 | loop filter |
| 15 | voltage-controlled oscillator |
| 16 | divider |
| 17 | detector circuit |
| 18 | amplifier |
| 19 | amplifier |
| 20 | CPU |
| 21 | memory |
| 22 | temperature sensor |
| 23 | fixed voltage supplying circuit |
| 24 | AD converter |
| 25 | AD converter |
| 32 | phase comparator |
| 33 | charge pump |
| 34 | loop filter |
| 35 | VCXO |
| 36 | divider |

DESCRIPTION OF THE PREFERRED EMBODIMENT

Summary of Embodiment

An embodiment of the present invention is described with reference to drawings.

An oscillation frequency control circuit according to the embodiment of the present invention has a voltage-controlled oscillator, a divider that divides an output from the voltage-controlled oscillator, a phase comparator that compares phases of an external reference signal and of an output from the divider to output a phase difference signal, a loop filter that smoothes an output from the phase comparator to output, a detector circuit that detects an input level of the external reference signal, a temperature sensor that detects temperature in the vicinity of the detector circuit, a memory that stores a voltage value for determining an adequate range and outside of the adequate range in accordance with temperature characteristics for detected voltage of the external reference signal, a fixed voltage supplying circuit that supplies fixed voltage, a selection switch that connects the phase comparator to the loop filter in an external reference synchronization mode, or connects the fixed voltage supplying circuit to the loop filter in a fixed voltage mode, and a controlling unit that outputs a control signal to switch the selection switch to the external reference synchronization mode if the detected voltage of an external reference signal level detected by the detector circuit is within the adequate range in accordance with the temperature characteristics of temperature detected by the temperature sensor, and outputs the control signal to switch the selection switch to the fixed voltage mode if the detected voltage is outside the adequate range in accordance with the temperature characteristics of the temperature detected by the temperature sensor, and is capable of correcting frequency thereof, determining the adequate range of the input level of the external reference signal in accordance with the temperature characteristics in detecting the external reference signal, and controlling control voltage to the voltage-controlled oscillator within and outside the adequate range, thereby performing highly stable oscillation operation.

Figure 1:
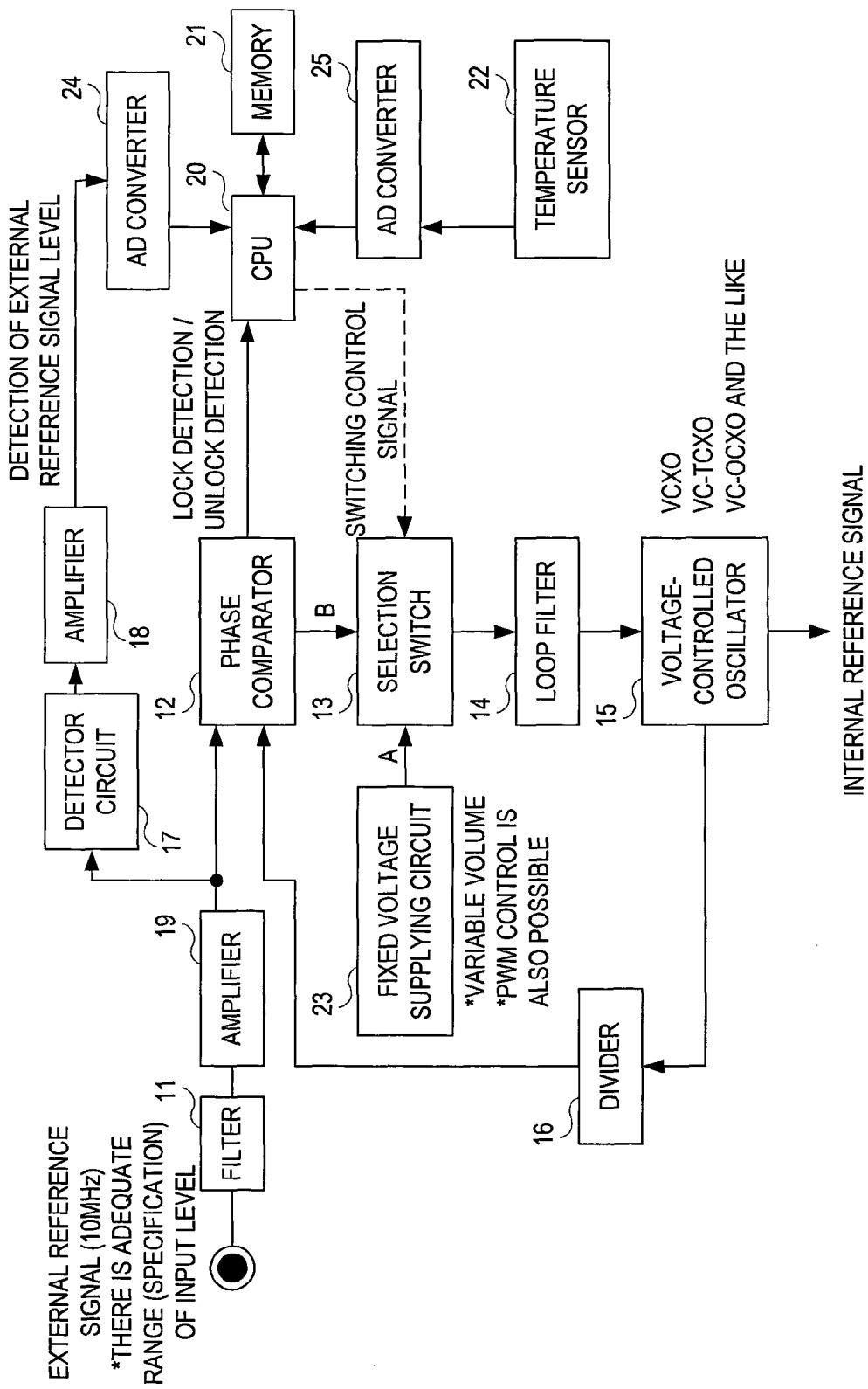
FIG. 1 is a configuration block diagram of a oscillation frequency control circuit according to an embodiment of the present invention.

[Oscillation Frequency Control Circuit: FIG. 1]

The oscillation frequency control circuit according to the embodiment of the present invention is described with reference to FIG. 1. FIG. 1 is a configuration block diagram of the oscillation frequency control circuit according to the embodiment of the present invention.

The oscillation frequency control circuit according to the embodiment of the present invention (this circuit) is composed of a filter 11, a phase comparator 12, a selection switch 13, a loop filter 14, a voltage-controlled oscillator 15, a divider 16, a detector circuit 17, an amplifier 18, an amplifier 19, a central processing unit (CPU) 20, a memory 21, a temperature sensor 22, a fixed voltage supplying circuit 23, an AD converter 24, and an AD converter 25, as shown in FIG. 1.

[Each Unit of this Circuit]

The filter 11 is, for example, a filter that band-limits the external reference signal (external REF) of 10 MHz. Although the filter 11 is not essential as a basic configuration, this has a function to remove a high-frequency component of the external reference signal.

The amplifier 19 amplifies an output signal from the filter 11 to output to the phase comparator 12 and the detector circuit 17.

The phase comparator 12 compares the phases of the reference signal output from the amplifier 19 and of the signal divided by the divider 16 to output the phase difference signal.

Meanwhile, when the phase comparator 12 compares the phases of the external reference signal and of the divided signal and detects synchronization (lock), the phase comparator 12 outputs a lock detection signal to the CPU 20, and when the phase comparator 12 detects unsynchronization (unlock), the phase comparator 12 outputs an unlock detection signal to the CPU 20.

The selection switch 13 performs switching to connect the phase comparator 12 to the loop filter 14, and to connect the fixed voltage supplying circuit 23 to the loop filter 14 by a switching control signal from the CPU 20.

That is to say, when the switching control signal (external reference synchronization mode selection signal) to select an external reference synchronization mode (B) for connecting the phase comparator 12 to the loop filter 14 to allow to operate by the external reference signal is input from the CPU 20, the selection switch 13 connects the phase comparator 12 to the loop filter 14. When the switching control signal (fixed voltage mode selection signal) to select a fixed voltage mode (A) for connecting the fixed voltage supplying circuit 23 to the loop filter 14 to allow to operate by the fixed voltage is input from the CPU 20, the selection switch 13 connects the fixed voltage supplying circuit 23 to the loop filter 14.

The loop filter 14 is a filter that smoothes output voltage from the phase comparator 12, that is to say, smoothes the control voltage input to the voltage-controlled oscillator 15.

The voltage-controlled oscillator 15 changes the frequency by the control voltage from the loop filter 14 to oscillation-output desired frequency (internal reference signal).

Meanwhile, a voltage controlled crystal oscillator (VCXO), a voltage controlled oven-controlled crystal oscillator (VC-OCXO) and the like may be used in place of the voltage-controlled oscillator (VCO).

The divider 16 divides the internal reference signal output from the voltage-controlled oscillator 15 into 1/N.

The detector circuit 17 performs level detection of the output signal from the amplifier 19.

The amplifier 18 amplifies the signal detected by the detector circuit 17.

The temperature sensor 22 is arranged in the vicinity of a circuit that affects detection characteristics of the filter 11, the detector circuit 17 and the amplifiers 18 and 19, and outputs a value of measured temperature to the AD converter 25. The AD converter 24 converts a detected level of the external REF output from the amplifier 18 from an analog signal to a digital signal to output to the CPU 20.

The AD converter 25 converts the value of the temperature from the temperature sensor 22 from the analog signal to the digital signal to input temperature information to the CPU 20.

The CPU 20 receives the temperature information from the AD converter 25, judges whether the value of the temperature information is within a range of a normal temperature condition, a range of a low temperature condition, or a range of a high temperature condition, and sets a detection threshold according to a result of the judgment.

Specifically, the CPU 20 judges whether the value of the temperature detected by the temperature sensor 22 is in a range (<Ta) of the low temperature condition lower than a lower limit value (Ta) of the range of the normal temperature condition, in a range (Tb<) of the high temperature condition higher than an upper limit value (Tb) of the range of the normal temperature condition, or in the range of the normal temperature condition (Ta≦, ≦Tb).

Then, the CPU 20 reads each detection threshold stored in the memory 21 corresponding to the above-described three ranges, and sets the same therein as the detection threshold for level detection of the external REF.

Specifically, in a case of the range of the normal temperature condition (Ta≦, ≦Tb), the detection threshold V without temperature offset is set, in a case of the range of the low temperature condition (<Ta), the detection threshold V+Va with the temperature offset +Va is set, and in a case of the range of the high temperature condition (Tb<), the detection threshold V−Vb with the temperature offset −Vb is set.

The detected temperature and a setting process of the detection threshold in the CPU 20 are described later in detail.

Also, the CPU 20 receives the detected level of the external REF (external REF detected voltage) from the AD converter 24, judges whether the detected level is within the adequate range obtained by the above-set detection threshold (voltage external REF detected voltage≦voltage HL). When the detected level is within the adequate range, it is set as a status 2, when the detected level is such that voltage HH<external REF detected voltage or external REF detected voltage<voltage LL (outside the acceptable range) relative to a lower limit acceptable value provided outside the adequate range (lower limit acceptable value: voltage LL [LL<LH]) and an upper limit acceptable value provided outside the adequate range (upper limit acceptable value: voltage HH [HL<HH]), it is set as a status 3, and when the detected level is such that voltage external REF detected voltage<voltage LH or voltage HL<external REF detected voltage≦voltage HH (not in the adequate range but in the acceptable range), it is set as a status 1.

The adequate range, the acceptable value, the acceptable range, the outside of the acceptable range, and the status of the external REF detected voltage are described later in detail.

Also, the CPU 20 outputs the switching control signal to the selection switch 13 so as to be either of the fixed voltage mode (A) or the external REF mode (B) according to the status. Mode selection according to the status is described in detail later.

The memory 21 stores each of the upper limit value HL and the upper limit acceptable value HH of the adequate range, and the lower limit value LH and the lower limit acceptable value LL of the adequate range, in accordance with the detection threshold according to the temperature characteristics, the offset value when there is the temperature offset and the temperature characteristics.

Specifically, the memory 21 stores the detection threshold V in the case of the normal temperature, the detection threshold V−Vb in the case of the high temperature, and the detection threshold V+Va in the case of the low temperature, and further stores the upper limit value HL and the upper limit acceptable value HH of each adequate range, and the lower limit value LH and the lower limit acceptable value LL of the adequate range at the normal temperature, the high temperature, and the low temperature, corresponding to the detection thresholds.

Meanwhile, in this circuit, since the CPU 20 may recognize input abnormality of the external reference signal by the detected level of the external REF output from the detector circuit 17 and the amplifier 18, the unlock detection signal from the phase comparator 12 is not used.

Figure 2:
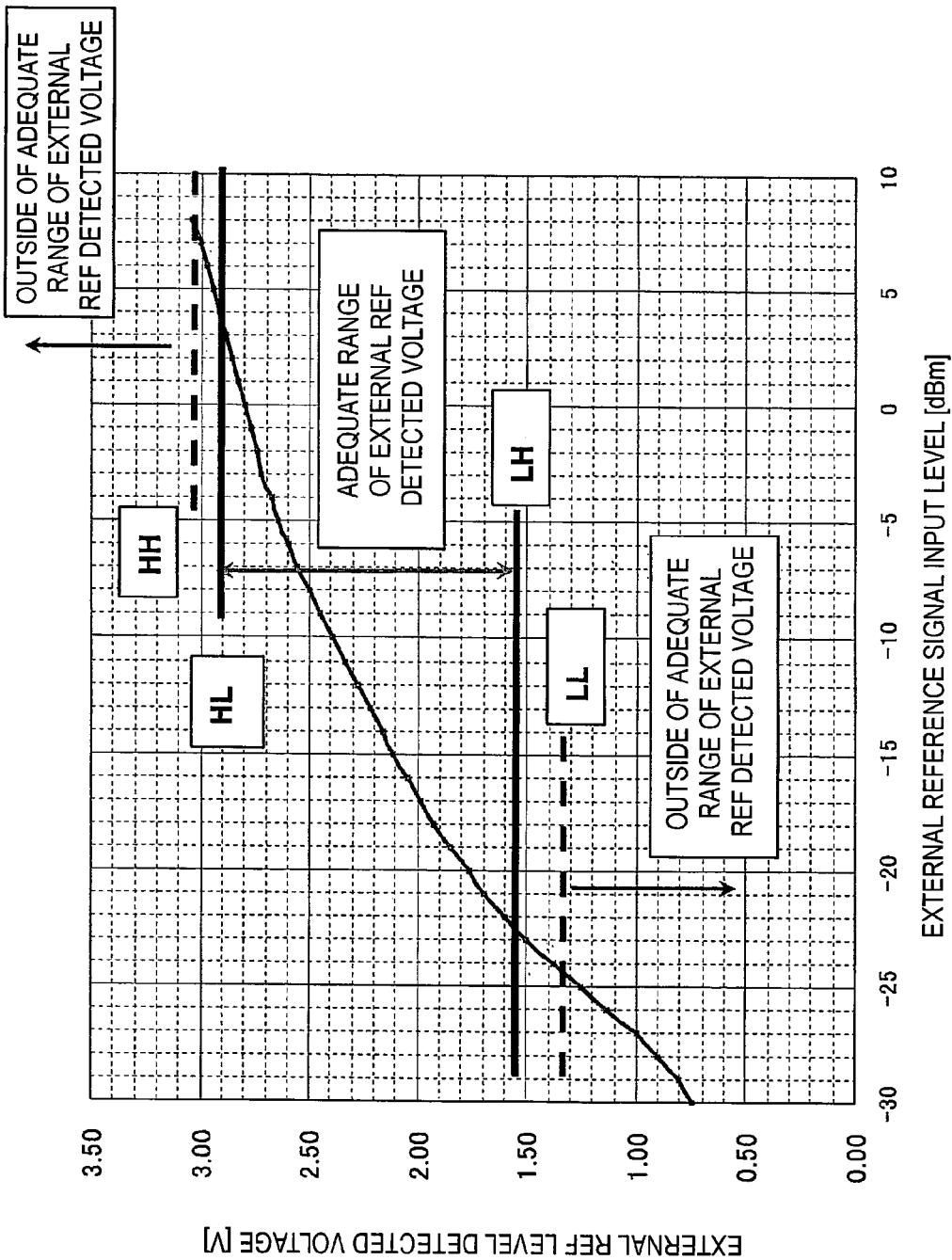
FIG. 2 is a view showing a summary of external reference signal level detection.

[External REF Level Detection: FIG. 2]

Next, a process of the external REF level detection in the CPU 20 is described with reference to FIG. 2. FIG. 2 is a view showing a summary of the external reference signal level detection.

FIG. 2 shows a curved line of an external REF level detected voltage [V] relative to an external reference signal input level [dBm], and the adequate range of the external REF detected voltage and the outside of the adequate range thereof are set by simulation and experiment relative to the characteristics of the curved line. The upper limit value and the lower limit value of the adequate range are set to the voltage HL and the voltage LH, and the upper limit acceptable value and the lower limit acceptable value, which are on boundaries outside with the adequate range are set to the voltage HH and the voltage LL, respectively.

Basically, it is configured to adopt the external reference synchronization mode (B) to synchronize with the external reference signal within the above-described adequate range, and to adopt the fixed voltage mode (A) to switch to the fixed voltage outside the adequate range.

Herein, in the vicinity of the adequate range, the voltage HH (upper limit acceptable value) higher than the upper limit value HL of the adequate range and the voltage LL (lower limit acceptable value) lower than the lower limit value LH of the adequate range are provided in order to stabilize switching operation so as to prevent frequent switching between the external reference synchronization mode (B) and the fixed voltage mode (A). When the external REF level detected voltage is higher than the voltage HH, this is set to be outside the adequate range, and when the external REF level detected voltage is lower than the voltage LL, this is also set to be outside the adequate range.

In a case in which the external REF level detected voltage is within the adequate range, the CPU 20 maintains the external reference synchronization mode (B) until the detected voltage increases to be higher than the voltage HL to reach the voltage HH or until the detected voltage decreases to be lower than the voltage LH to reach the voltage LL.

Then, when the external REF level detected voltage is higher than the voltage HH, or lower than the voltage LL, the CPU 20 switches to the fixed voltage mode (A) as outside the adequate range.

Further, the CPU 20 maintains the fixed voltage mode (A) when the external REF level detected voltage is not lower than the voltage HH and gradually decreases to the voltage HH, and switches to the external reference synchronization mode (B) when the external REF level detected voltage decreases to the voltage HL.

Also, the CPU 20 maintains the fixed voltage mode (A) when the external REF level detected voltage is not higher than the voltage LL and gradually increases to the voltage LL, and switches to the external reference synchronization mode (B) when the external REF level detected voltage increases to the voltage LH.

In this circuit, the upper limit value HL and the lower limit value LH of the adequate range and the lower limit value (upper limit acceptable value) HH outside the adequate range and the upper limit value (lower limit acceptable value) LL outside the adequate range are used, and the upper limit acceptable value HH and the lower limit acceptable value LL are used to switch from the external reference synchronization mode (B) to the fixed voltage mode (A), and the upper limit value HL and the lower limit value LH of the adequate range are used to switch from the fixed voltage mode (A) to the external reference synchronization mode (B).

Figure 3:
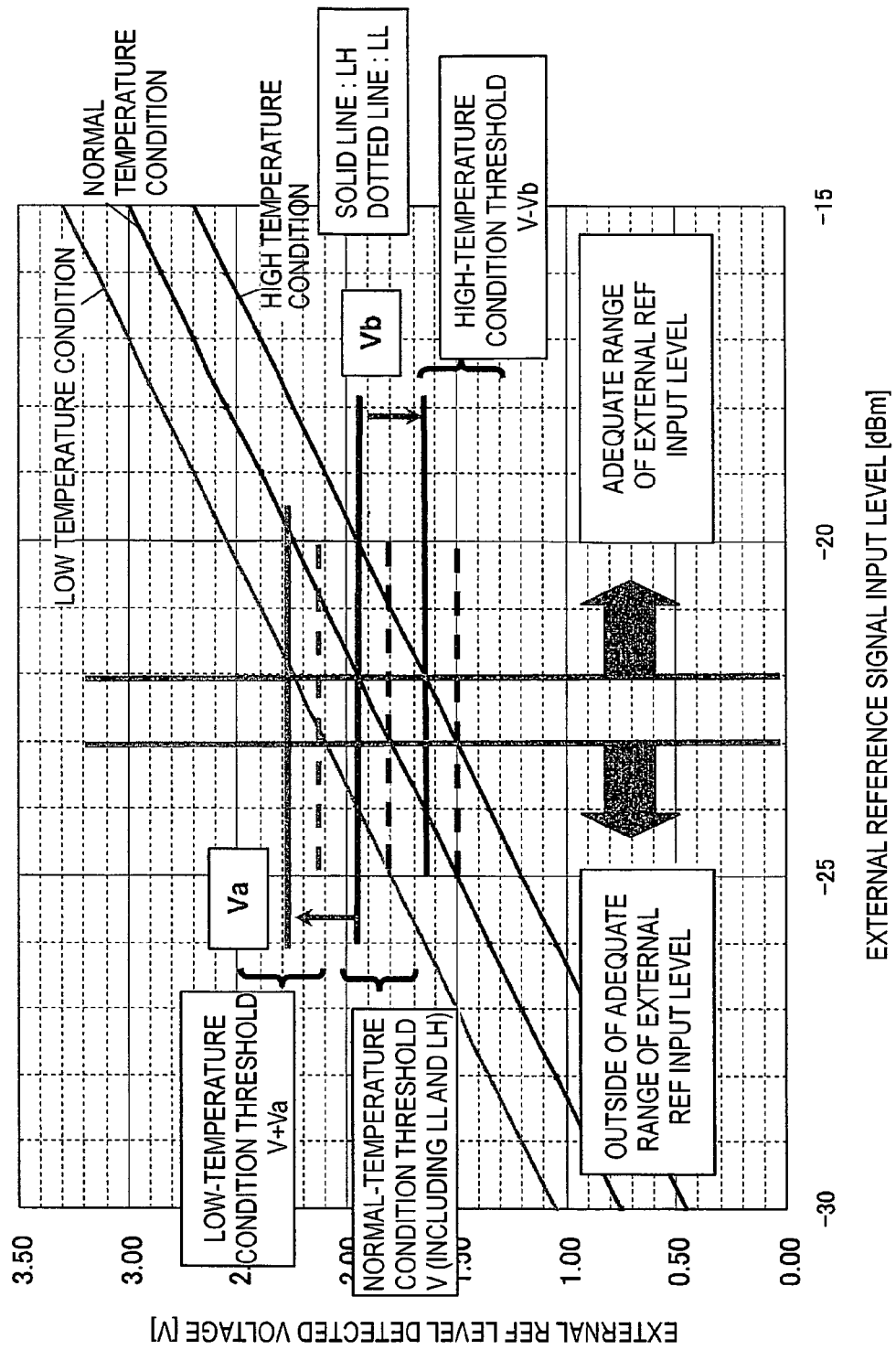
FIG. 3 is a view showing temperature characteristics of external reference signal detected voltage of a low input condition.

[Temperature Characteristics of External REF Detected Voltage: FIG. 3]

Herein, a method of determining the lower limit value LH and the lower limit acceptable value LL of the adequate range and the upper limit value HL and the upper limit acceptable value HH of the adequate range in this circuit is described with reference to FIG. 3. FIG. 3 is a view showing the temperature characteristics of the external reference signal detected voltage of a low input condition.

Meanwhile, although it is required to determine the value for both of the low input condition and a high input condition in order to obtain the above-described each value, it is described based on an example of the low input condition in FIG. 3.

The temperature characteristics of the external REF detected voltage may be represented by three diagonal lines in the order of the low temperature condition, the normal temperature condition and the high temperature condition as shown in FIG. 3. Meanwhile, temperature ranges corresponding to the low temperature condition, the normal temperature condition and the high temperature condition are determined in advance for the temperature detected by the temperature sensor 22.

In a case in which the temperature detected by the temperature sensor 22 is within the temperature range of the normal temperature condition, the normal temperature condition threshold V, which is the adequate range of the external REF input level, is obtained, and the normal temperature condition threshold V is set to the lower limit value LH of the adequate range, and further, the lower limit acceptable value LL is determined.

In a case in which the temperature detected by the temperature sensor 22 is within the temperature range of the low temperature condition, the low temperature condition threshold V+Va, which is the adequate range of the external REF input level, is obtained, and the low temperature condition threshold V+Va is set to the lower limit value LH of the adequate range, and further, the lower limit acceptable value LL is determined.

In FIG. 3, the lower limit value LH of the adequate range is approximately 2.25 V, which is the external REF level detected voltage when the external REF input level is approximately −22 dBm, and the lower limit acceptable value LL is approximately 2.10 V, which is the external REF level detected voltage when the external REF input level is approximately −23 dBm.

In a case in which the temperature detected by the temperature sensor 22 is within the temperature range of the high temperature condition, the high temperature condition threshold V−Vb, which is the adequate range of the external REF input level, is obtained, and the high temperature condition threshold V−Vb is set to the lower limit value LH of the adequate range, and further, the lower limit acceptable value LL is determined.

In FIG. 3, the lower limit value LH of the adequate range is approximately 1.65 V, which is the external REF level detected voltage when the external REF input level is approximately −22 dBm, and the lower limit acceptable value LL is approximately 1.50 V, which is the external REF level detected voltage when the external REF input level is approximately −23 dBm.

In this manner, the lower limit value LH and the lower limit acceptable value LL of each adequate range are determined based on the temperature characteristics in accordance with the cases in which the temperature detected by the temperature sensor 22 is the low temperature, the normal temperature and the high temperature, and are used as the lower limit value LH and the lower limit acceptable value LL of the adequate range for determining the adequate range and the outside of the adequate range shown in FIG. 2.

Although the example of the low input condition is described in the example shown in FIG. 3, similarly, in the high input condition also, the upper limit value HL and the upper limit acceptable value HH of the adequate range are determined and are used.

Although the four values of LL, LH, HL and HH are determined by typifying into the three temperature characteristics of the low temperature condition, the normal temperature condition and the high temperature condition in the above-described example shown in FIG. 3, it is also possible to further subdivide or determine the above-described four values for each detected temperature in accordance with the temperature characteristics calculated for each temperature.

In this case, the above-described four values for each temperature may be stored in the memory 21 as a table (adequate range determining table), and the CPU 20 may obtain the above-described four values by referring to the adequate range determining table based on the value of the detected temperature.

[Operation of this Circuit]

Operation of this circuit is described.

In this circuit, at the time of start-up, the CPU 20 outputs the switching control signal to the selection switch 13 so as to select the fixed voltage mode (A), and the selection switch 13 is in a state of connecting the fixed voltage supplying circuit 23 to the loop filter 14. Thereby, the fixed voltage supplied from the fixed voltage supplying circuit 23 is input to the voltage-controlled oscillator 5 through the loop filter 14, and oscillation operation is performed by the voltage-controlled oscillator 15.

Then, the CPU 20 judges whether the external reference signal is within the adequate range by the temperature information from the AD converter 25 and by information of the external REF level detected voltage from the AD converter 24. When the external reference signal is within the adequate range, the CPU 20 outputs the switching control signal to the selection switch 13 so as to select the external reference synchronization mode (B), and the selection switch 13 puts the phase comparator 12 and the loop filter 14 into a connected state. Thereby, the phase comparator 12 outputs the signal of the phase difference between the external reference signal and the signal from the divider 16 to the voltage-controlled oscillator 15 through the loop filter 14, thereby controlling oscillation frequency in the voltage-controlled oscillator 15.

Also, in this circuit, the external reference signal is detected by the detector circuit 17 and amplified by the amplifier 18, and the level of the external REF is detected to be output to the CPU 20 through the AD converter 24.

In the CPU 20, it is judged whether the detected level of the input external REF is within the adequate range determined in accordance with the temperature detected by the temperature sensor 22.

Specifically, the CPU 20 reads the upper limit value HL and the lower limit value LH, and the upper limit acceptable value HH and the lower limit acceptable value LL indicating the adequate range in accordance with the temperature characteristics stored in the memory 21. When there is the value of the detected level of the external REF between the upper limit value HL and the lower limit value LH, this is judged to be within the adequate range, and when the value of the detected level of the external REF is higher than the upper limit acceptable value HH or lower than the lower limit acceptable value LL, this is judged to be outside the adequate range.

As a result of the judgment, in the case of within the adequate range, the CPU 20 outputs the switching control signal to select the external reference synchronization mode (B) to the selection switch 13 as a normal state and connects the phase comparator 12 to the loop filter 14, and in the case of outside the adequate range, this outputs the switching control signal to select the fixed voltage mode (A) to the selection switch 13 as an abnormal state and connects the fixed voltage supplying circuit 23 to the loop filter 14.

Thereby, when abnormality occurs in the external reference signal, especially, when the input of the external reference signal disappears (at the time of free-running) and the like, the CPU 20 immediately detects the abnormality by the output from the detector circuit 17 and the amplifier 18, disconnects the output of the phase comparator 12, and controls the voltage-controlled oscillator 15 by the fixed voltage supplied from the fixed voltage supplying circuit 23.

That is to say, by using the output from the fixed voltage supplying circuit 23 in place of the output of the phase comparator 12 at the time of start-up and abnormality, the frequency oscillation in the voltage-controlled oscillator 15 may be made appropriate.

Figure 4:
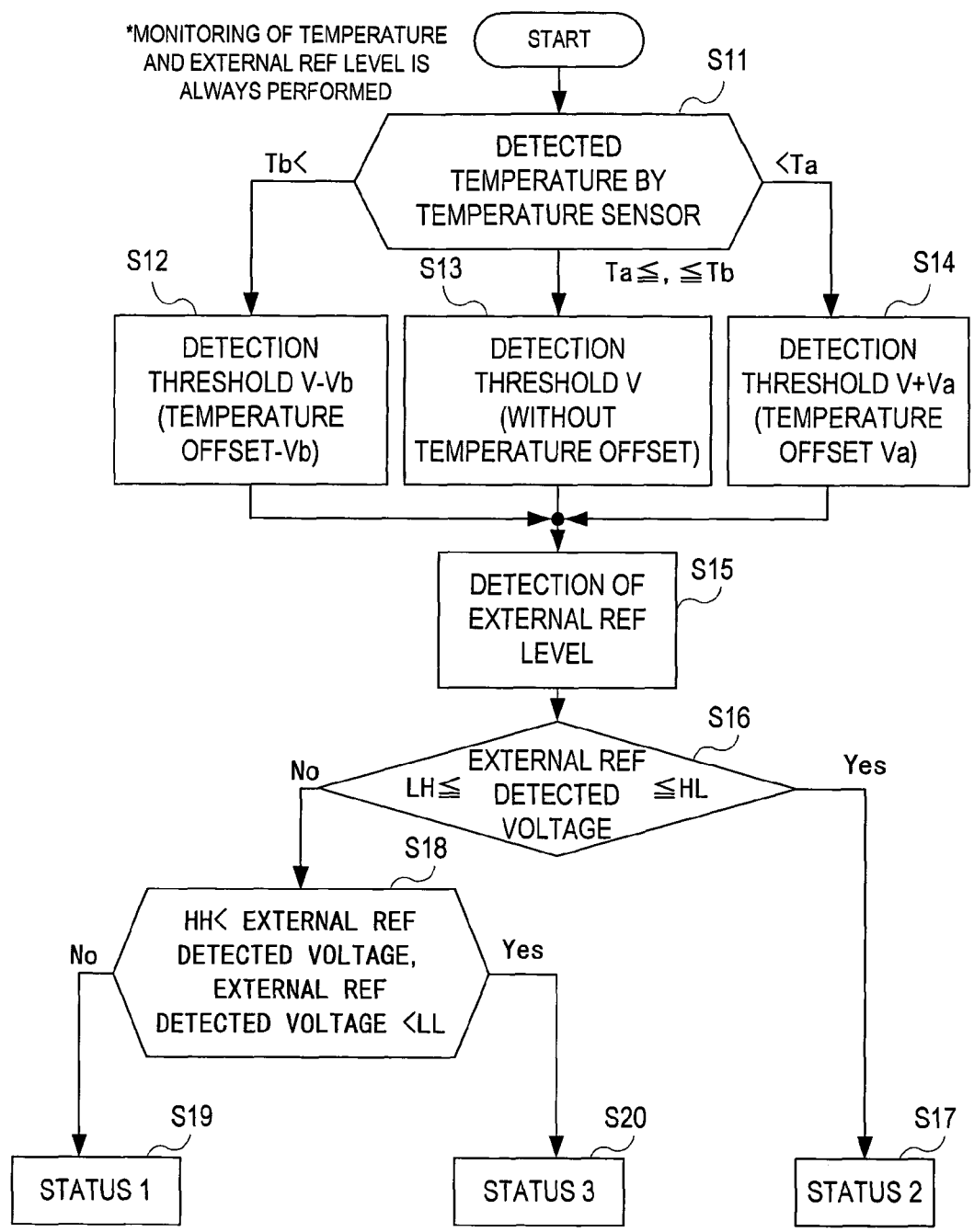
FIG. 4 is a flow chart of a status determining process in accordance with the temperature characteristics.

[Status Determining Process: FIG. 4]

Next, a status (state) determining process in accordance with the temperature characteristics is described with reference to FIG. 4. FIG. 4 is a flow chart of the status determining process according to the temperature characteristics.

As shown in FIG. 4, the value of the temperature detected by the temperature sensor 22 is converted into the digital value by the AD converter 25 and is output to the CPU 20, and the CPU 20 judges the temperature information (S11).

The CPU 20 sets the normal temperature condition detection threshold V (without temperature offset) stored in the memory 21 when the temperature is in the normal temperature condition (Ta≦, ≦Tb) (S13), sets the low temperature condition detection threshold V+Va (temperature offset +Va) stored in the memory 21 when the temperature is in the low temperature condition (<Ta) (S14), and sets the high temperature condition detection threshold V−Vb (temperature offset −Vb) stored in the memory 21 when the temperature is in the high temperature condition (Tb<) (S12).

Next, the CPU 20 inputs the value of the external REF level detected voltage input from the AD converter 24, and obtains the upper limit value HL, the lower limit value LH, the upper limit acceptable value HH and the lower limit acceptable value LL of the adequate range corresponding to the detection threshold set in the processes S12 to S14 from the memory 21 (S16).

Then, the CPU 20 judges whether the input external REF level detected voltage (external REF level detected voltage) is within the adequate range, that is to say, whether this is in a relationship of the lower limit value LH of the adequate range≦the external REF level detected voltage≦the upper limit value HL of the adequate range (S16).

When this is in the relationship of the lower limit value LH of the adequate range≦the external REF level detected voltage≦the upper limit value HL of the adequate range (at the time of Yes), the state is determined to be the "status 2" within the adequate range (S17).

When this is not in the relationship of the lower limit value LH of the adequate range≦the external REF level detected voltage≦the upper limit value HL of the adequate range (at the time of No), next, it is judged whether this is within the adequate range, that is to say, whether this is in the relationship of the upper limit acceptable value HH<external REF level detected voltage, or the external REF level detected voltage<the lower limit acceptable value LL (S18).

When this is in the relationship of the upper limit acceptable value HH<the external REF level detected voltage, or the external REF level detected voltage<the lower limit acceptable value LL (at the time of Yes), the state is determined to be the "status 3" outside the adequate range (S20).

Also, when this is not in the relationship of the upper limit acceptable value HH<the external REF level detected voltage, or the external REF level detected voltage<the lower limit acceptable value LL (at the time of No), the state is determined to be the "status 1" not in the adequate range but in the acceptable range (S19).

Meanwhile, the process in FIG. 4 is continuously or periodically performed, and the status is occasionally determined and is changed according to the temperature change.

Figure 5:
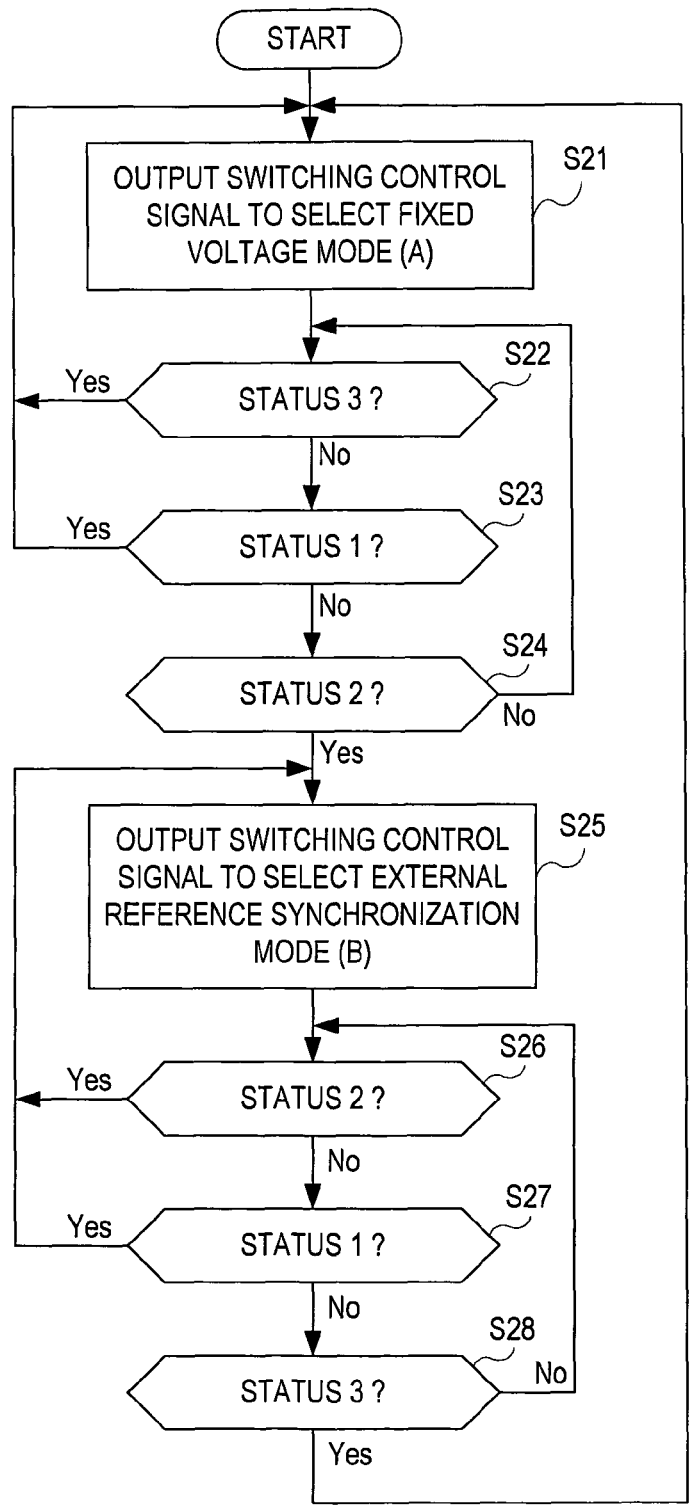
FIG. 5 is a flow chart of a selection switch switching control process.
Figure 6:
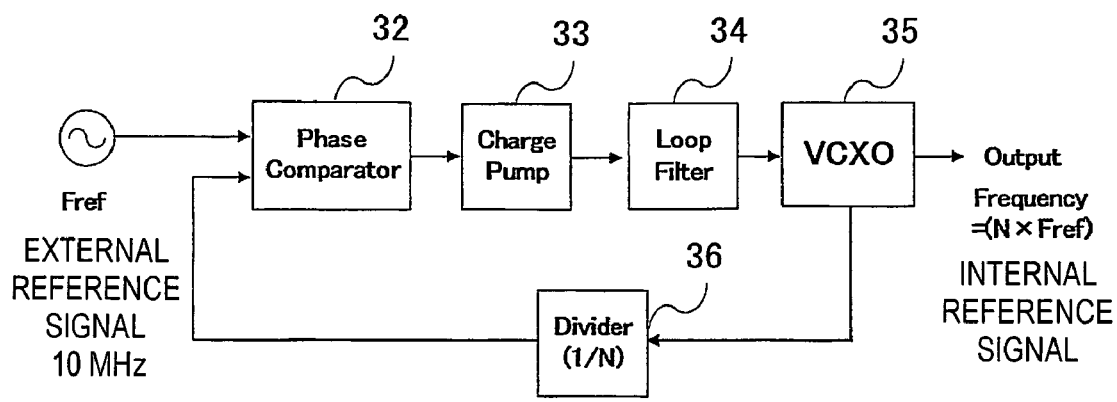
FIG. 6 is a configuration block diagram of a general PLL circuit.

[Selection Switch Switching Control Process: FIG. 5]

Next, a selection switch switching control process according to the above-determined status is described with reference to FIG. 5. FIG. 5 is a flow chart of the selection switch switching control process.

As shown in FIG. 5, at the start-up of this circuit, the CPU 20 outputs the switching control signal to select the fixed voltage mode (A) to the selection switch 13, and outputs the fixed voltage supplied from the fixed voltage supplying circuit 23 to the loop filter 14 (S21).

The CPU 20 first judges whether it is the "status 3" outside the adequate range based on the information of the status determined in FIG. 4 (S22), and in the case of the "status 3" (at the time of Yes), returns to the process S21.

When it is not the "status 3" (at the time of No), the CPU 20 judges whether it is the "status 1" not in the adequate range but in the acceptable range (S23), and when it is the "status 1" (at the time of Yes), returns to the process S21.

When it is not the "status 1" (at the time of No), the CPU 20 judges whether it is the "status 2" within the adequate range (S24), and when it is not the "status 2" (at the time of No), returns to the judgment process S22.

Also, when it is the "status 2" (at the time of Yes), the CPU 20 outputs the switching control signal to select the external reference synchronization mode (B) to the selection switch 13, and outputs the voltage from the phase comparator 12 to the loop filter 14 (S25).

Then, the CPU 20 further judges whether it is the "status 2" within the adequate range (S24), and when it is the "status 2" (at the time of Yes), returns to the process S25.

When it is not the "status 2" (at the time of No), the CPU 20 judges whether it is the "status 1" not in the adequate range but in the acceptable range (S27), and when it is the "status 1" (at the time of Yes), returns to the process S25.

When it is not the "status 1" (at the time of No), the CPU 20 judges whether it is the "status 3" outside the adequate range (S22), and when it is not the "status 3" (at the time of No), returns to the judgment process S26.

Then, when it is the "status 3" (at the case of Yes), the CPU 20 returns to the process S21.

In this manner, the CPU 20 performs the switching control process of the selection switch 13.

Effect of Embodiment

According to this circuit, the adequate range and the outside of the adequate range are changed based on the threshold obtained from the temperature characteristics corresponding to the temperature detected by the temperature sensor 22, the fixed voltage mode (A) is selected at the time of start-up and outside the adequate range, and the external reference synchronization mode (B) is selected within the adequate range, so that there is an effect that the stable oscillation control of the voltage-controlled oscillator 15 may be realized.

Also, according to this circuit, the selection switch 13 is switched by using the upper limit value HL, the lower limit value LH, the upper limit acceptable value HH and the lower limit acceptable value LL of the adequate range for judging the adequate range and the outside of the adequate range, so that the selection switch 13 is not frequently switched, and there is an effect that the stable switching operation may be performed.

The present invention is suitable for the highly stable oscillation frequency control circuit in which the frequency thereof is corrected, the adequate range of the input level of the external reference signal is determined according to the temperature characteristics in detecting the external reference signal, and the control voltage to the voltage-controlled oscillator is controlled within and outside the adequate range.

What is claimed is:

1. An oscillation frequency control circuit, comprising:
a voltage-controlled oscillator;
a divider that divides an output from the voltage-controlled oscillator;
a phase comparator that compares phases of an external reference signal and of the output from the divider to output a phase difference signal;
a loop filter that smoothes the output from the phase comparator to output;
a detector circuit that detects an input level of the external reference signal;
a temperature sensor that detects temperature in the vicinity of the detector circuit;
a memory that stores a voltage value for determining an adequate range and outside of the adequate range in accordance with temperature characteristic for detected voltage of the external reference signal;
a fixed voltage supplying circuit that supplies fixed voltage;
a selection switch that connects the phase comparator to the loop filter in an external reference synchronization mode or connects the fixed voltage supplying circuit to the loop filter in a fixed voltage mode; and
a controlling unit that outputs a control signal to switch the selection switch to the external reference synchronization mode when the detected voltage of an external reference signal level detected by the detector circuit is within the adequate range in accordance with the temperature characteristics of the temperature detected by the temperature sensor, and outputs the control signal to switch the selection switch to the fixed voltage mode when the detected voltage is outside the adequate range in accordance with the temperature characteristics of the temperature detected by the temperature sensor.

2. The oscillation frequency control circuit according to claim 1, wherein
the controlling unit outputs the control signal to switch the selection switch to the fixed voltage mode at the time of start-up, and outputs the control signal to switch the selection switch to the external reference synchronization mode when the detected voltage of the external reference signal level detected by the detector circuit is within the adequate range.

3. The oscillation frequency control circuit according to claim 1, wherein
the voltage value for determining the adequate range and the outside of the adequate range in accordance with the temperature characteristics for the detected voltage of the external reference signal level is stored in the memory for each of the temperature characteristics based on a detection threshold in accordance with the temperature characteristics.

4. The oscillation frequency control circuit according to claim 2, wherein
the voltage value for determining the adequate range and the outside of the adequate range in accordance with the temperature characteristics for the detected voltage of the external reference signal level is stored in the memory for each of the temperature characteristics based on a detection threshold in accordance with the temperature characteristics.

5. The oscillation frequency control circuit according to claim 3, wherein
the voltage value for determining the adequate range and the outside of the adequate range in accordance with the temperature characteristics for the detected voltage of the external reference signal level stores an upper limit value HL of the adequate range, a lower limit value LH of the adequate range, an upper limit acceptable value HH acceptable on a boundary with the outside of the adequate range, and a lower limit acceptable value LL acceptable on the boundary with the outside of the adequate range in the memory for each of the temperature characteristics.

6. The oscillation frequency control circuit according to claim 4, wherein
the voltage value for determining the adequate range and the outside of the adequate range in accordance with the temperature characteristics for the detected voltage of the external reference signal level stores an upper limit value HL of the adequate range, a lower limit value LH of the adequate range, an upper limit acceptable value HH acceptable on a boundary with the outside of the adequate range, and a lower limit acceptable value LL acceptable on the boundary with the outside of the adequate range in the memory for each of the temperature characteristics.

7. The oscillation frequency control circuit according to claim 5, wherein the controlling unit outputs the control signal to switch the selection switch to the fixed voltage mode in a case in which the value of the detected voltage of the external reference signal level is within the adequate range and when the value of the detected voltage increases to be not lower than the upper limit value HL to be higher than the upper limit acceptable value HH, or when the value of the detected voltage decreases to be not higher than the lower limit value LH to be lower than the lower limit acceptable value LL, and outputs the control signal to switch the selection switch to the external reference synchronization mode in a case in which the value of the detected voltage of the external reference signal level is outside the adequate range and when the value of the detected voltage increases to be higher than the lower limit acceptable value LL to be not lower than the lower limit value LH of the adequate range, or when the value of the detected voltage decreases to be lower than the upper limit acceptable value HH to be not higher than the upper limit value HL of the adequate range.

8. The oscillation frequency control circuit according to claim 6, wherein the controlling unit outputs the control signal to switch the selection switch to the fixed voltage mode in a case in which the value of the detected voltage of the external reference signal level is within the adequate range and when the value of the detected voltage increases to be not lower than the upper limit value HL to be higher than the upper limit acceptable value HH, or when the value of the detected voltage decreases to be not higher than the lower limit value LH to be lower than the lower limit acceptable value LL, and outputs the control signal to switch the selection switch to the external reference synchronization mode in a case in which the value of the detected voltage of the external reference signal level is outside the adequate range and when the value of the detected voltage increases to be higher than the lower limit acceptable value LL to be not lower than the lower limit value LH of the adequate range, or when the value of the detected voltage decreases to be lower than the upper limit acceptable value HH to be not higher than the upper limit value HL of the adequate range.

\* \* \* \* \*